United States Patent
Tsao et al.

(10) Patent No.: US 12,093,090 B2
(45) Date of Patent: Sep. 17, 2024

(54) COMPUTER CASE ASSEMBLY

(71) Applicant: IN WIN DEVELOPMENT INC., Taoyuan (TW)

(72) Inventors: Ling-Cheng Tsao, Taoyuan (TW); Chao-Hung Wang, Taoyuan (TW)

(73) Assignee: IN WIN DEVELOPMENT INC., Taoyuan (TW)

( * ) Notice: Subject to any disclaimer, the term of this patent is extended or adjusted under 35 U.S.C. 154(b) by 106 days.

(21) Appl. No.: 18/148,219

(22) Filed: Dec. 29, 2022

(65) Prior Publication Data

US 2024/0143042 A1    May 2, 2024

(30) Foreign Application Priority Data

Oct. 28, 2022   (TW) .................................. 111141069

(51) Int. Cl.
*G06F 1/18*     (2006.01)
*H05K 5/02*     (2006.01)

(52) U.S. Cl.
CPC .............. *G06F 1/181* (2013.01); *G06F 1/184* (2013.01); *G06F 1/188* (2013.01); *H05K 5/0247* (2013.01)

(58) Field of Classification Search
CPC ....................................................... H05K 5/00
See application file for complete search history.

(56) References Cited

U.S. PATENT DOCUMENTS 6,469,901 B1 *  10/2002  Costner ............... H05K 7/1442
                                                  361/733
6,490,157 B2 *  12/2002  Unrein ..................... G06F 1/20
                                                  361/679.46

FOREIGN PATENT DOCUMENTS

TW      M593578 U     4/2020
TW      202144956 A  12/2021

OTHER PUBLICATIONS

Search Report appended to an Office Action, which was issued to Taiwanese counterpart application No. 111141069 by the TIPO on Jul. 10, 2023, with an English translation thereof (2 pages).

* cited by examiner

*Primary Examiner* — Jerry Wu
(74) *Attorney, Agent, or Firm* — HSML P.C.

(57) ABSTRACT

A computer case assembly is adapted for computer component units of a computer system to be mounted to. The computer component units include a motherboard and a power supply unit. The computer case assembly includes a main case module and a power case module. The main case module includes a main frame that is cuboid-shaped and that is adapted for the motherboard to be mounted to. The power case module includes a power case frame that is cuboid-shaped, that is adapted for the power supply unit to be mounted to, and that is detachably mounted to the main frame.

1 Claim, 18 Drawing Sheets

COMPUTER CASE ASSEMBLY

CROSS-REFERENCE TO RELATED APPLICATION

This application claims priority to Taiwanese Invention Patent Application No. 111141069, filed on Oct. 28, 2022.

FIELD

The disclosure relates to a computer case assembly of a computer system, and more particularly to a computer case assembly that allows a user to flexibly arrange positions of computer components or add more computer components inside the computer case assembly.

BACKGROUND

Currently, most of computer cases have fixed shapes with fixed volumes. For each of the computer cases, positions of a motherboard, a power supply unit, and other component units are all predetermined at manufacturing, and hence flexibility of re-arranging the positions of these component units is limited. In addition, due to a volume of a computer case being fixed, flexibility of scaling up the component units in number is also limited.

SUMMARY

Therefore, an object of the disclosure is to provide a computer case assembly that can alleviate at least one of the drawbacks of the prior art.

According to the disclosure, the computer case assembly is adapted for computer component units of a computer system to be mounted to. The computer component units include a motherboard and a power supply unit. The computer case assembly includes a main case module and a power case module. The main case module includes a main frame that is cuboid-shaped and that is adapted for the motherboard to be mounted to. The power case module includes a power case frame that is cuboid-shaped, that is adapted for the power supply unit to be mounted to, and that is detachably mounted to the main frame.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
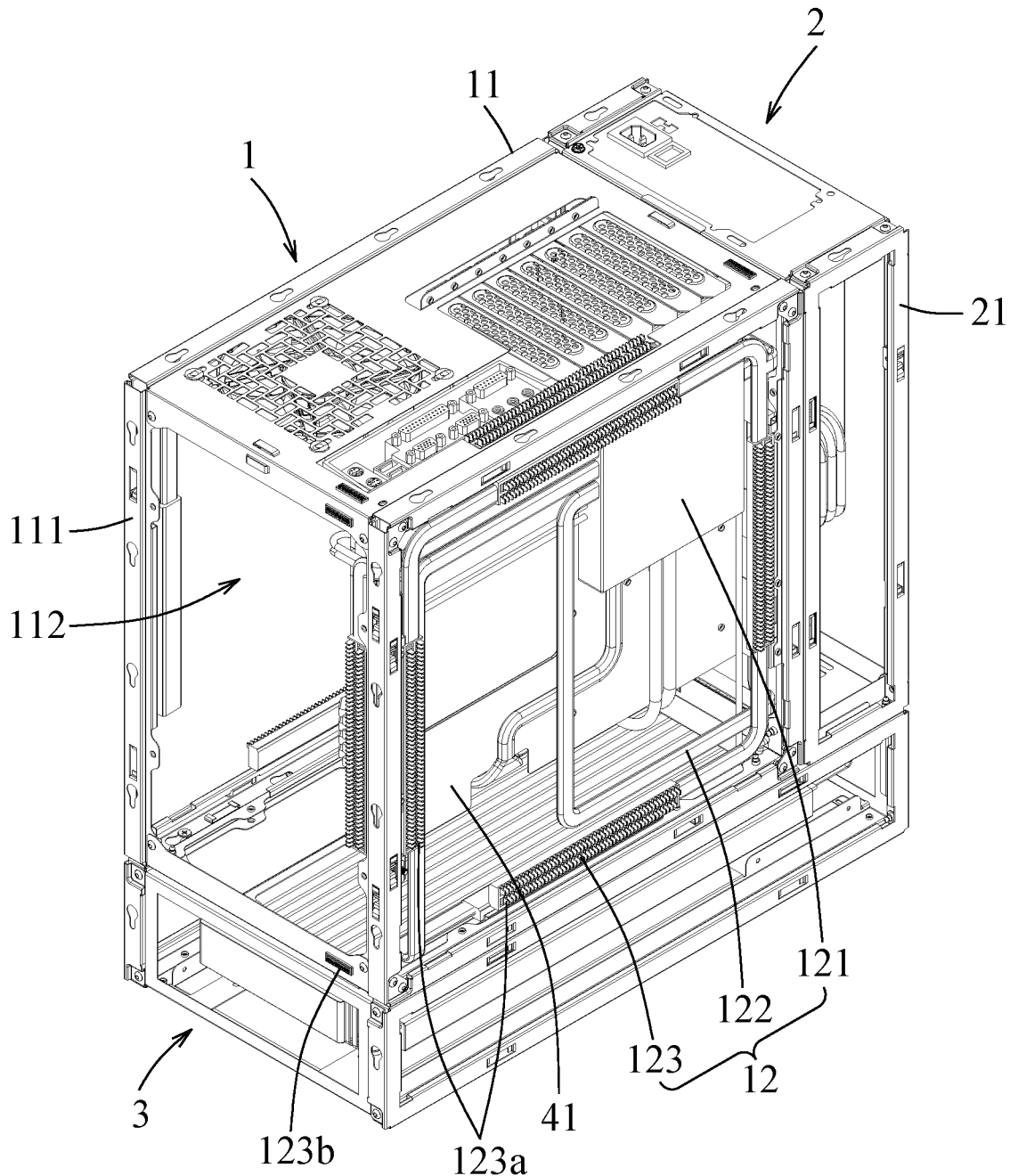
FIG. 1 is a perspective view of a first embodiment of a computer case assembly according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
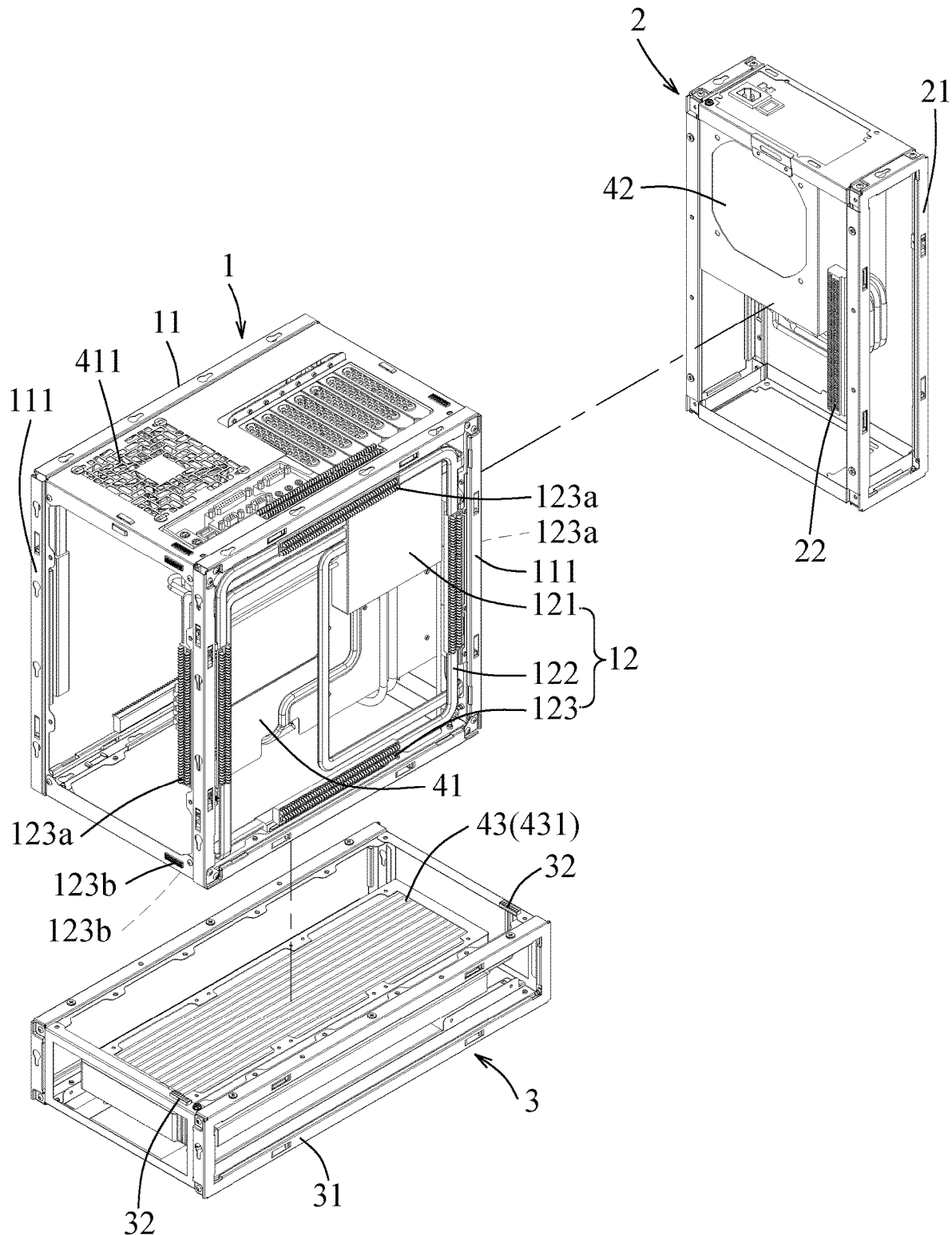
FIG. 2 is a partly exploded perspective view of the first embodiment.
Figure 3:
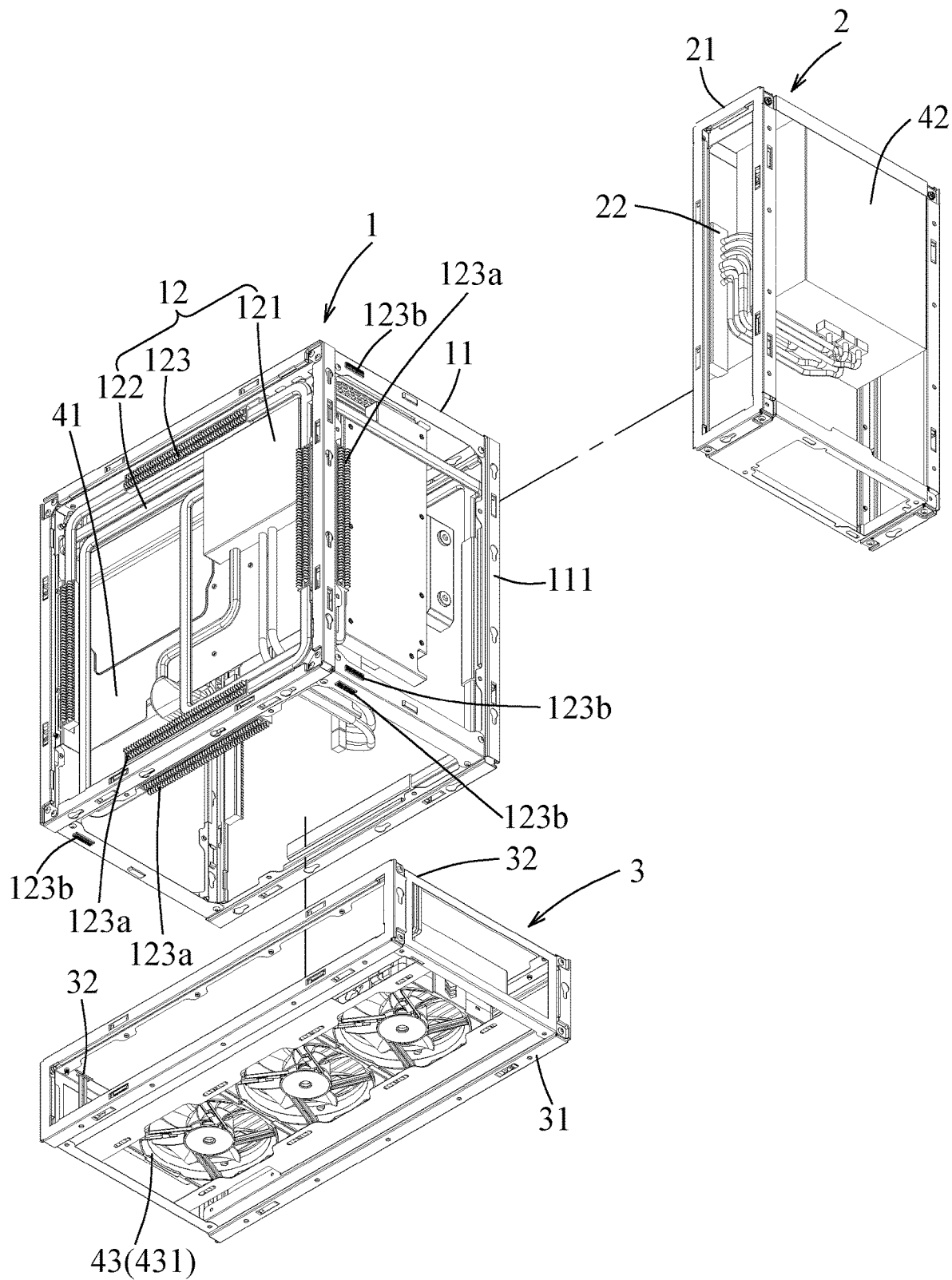
FIG. 3 is a partly exploded perspective view of the first embodiment taken from another angle.

Referring to FIGS. 1 to 3, a first embodiment of a computer case assembly according to the disclosure is adapted for computer component units of a computer system to be mounted to. The computer component units include a motherboard 41, a power supply unit 42, and at least one functional unit 43. The at least one functional unit 43 may include, for example, a heat-dissipating unit, a hard disk unit, or a graphics processing unit (hereinafter also referred to as "GPU"). In the first embodiment, the at least one functional unit 43 includes a heat-dissipating unit 431 that includes a plurality of main fans. The computer case assembly includes a main case module 1, a power case module 2, and a function case module 3.

The main case module 1 includes a main frame 11 and an electrical connection unit 12. The main frame 11 is cuboid-shaped and is adapted for the motherboard 41 to be mounted to. The electrical connection unit 12 is mounted to the main frame 11. The main frame 11 has six outer side surfaces 111. Each of the outer side surfaces 111 is hollow (i.e., each of the outer side surfaces 111 surrounds an imaginary axis). The outer side surfaces 111 cooperatively define an accommodating space 112 thereamong. In the first embodiment, height, length, and width of the main frame 11 are unequal, but in one embodiment, the height, the length, and the width of the main frame 11 may be equal (i.e., the main frame may be cube-shaped since a cube possesses all of the properties of a cuboid). The motherboard 41 is mounted to the main frame 11 and is located in the accommodating space 112. The electrical connection unit 12 includes an adaptor subunit 121, a wire subunit 122, and a plurality of electrical connectors 123. The adaptor subunit 121 is electrically coupled to the motherboard 41 and the electrical connectors 123 via the wire subunit 122 so that electrical power and signals may be transferred among the motherboard 41 and the electrical connectors 123. The adaptor subunit 121 may include an electronic circuit and a storage member. The electrical connectors 123 are mounted to the outer side surfaces 111 of the main frame 11. In the first embodiment, the electrical connectors 123 includes a plurality of blade connectors 123a and a plurality of pogo pins 123b, and each of the outer side surfaces 111 is provided with at least one of the blade connectors 123a and at least one of the pogo pins 123b.

The power case module 2 includes a power case frame 21 and a power mating connector 22. The power case frame 21 is cuboid-shaped, is adapted for the power supply unit 42 to be mounted to, and is detachably mounted to the main frame 11. The power mating connector 22 is mounted to the power case frame 21, is adapted to be electrically coupled to the power supply unit 42, and mates with one of the blade connectors 123a of the electrical connectors 123 that is mounted to the main frame 11 when the power case frame 21 is mounted to the main frame 11. In the first embodiment, the power case frame 21 is mounted to one of the outer side surfaces 111 of the main frame 11, and the power mating connector 22 is configured to be another blade connector that mates with the at least one of the blade connectors 123a on the one of the outer side surfaces 111 so that electric power provided by the power supply unit 42 may be transferred to motherboard 41 through the adaptor subunit 121. Because each of the outer side surfaces 111 is provided with the at least one of the blade connectors 123a and the at least one of the pogo pins 123b, a user may mount the power case module 2 to any one of the outer side surfaces 111 of the main frame 11 that the user prefers as long as the user mates the power mating connector 22 with the at least one of the blade connectors 123a of the one of the outer side surfaces 111 that is chosen by the user. In addition, the power case frame 21 may be secured to the main frame 11 by, but not limited by, screws (not shown). Therefore, the user may change a relative position between the power case module 2 and the main case module 1 according to actual requirements, and may assemble the power case module 2 and the main case module 1 in a relatively short period.

The function casing module 3 includes a function case frame 31 and a function mating connector 32. The function case frame 31 is cuboid-shaped, is adapted for the at least one functional unit 43 to be mounted to, and is detachably mounted to the main frame 11. The function mating connector 32 is mounted to the function case frame 31, is adapted to be electrically coupled to the at least one functional unit 43, and mates with one of the pogo pins 123b of the electrical connectors 123 that is mounted to the main frame 11 when the function case frame 31 is mounted to the main frame 11. In the first embodiment, as shown in FIGS. 1 and 2, the function case frame 31 is mounted to a bottom side of the main frame 11, and the power case frame 21 is mounted to a rear side of the main frame 11 (i.e., the function case frame 31 is mounted to one of the outer side surfaces 111 of the main frame 11 while the power case frame 21 is mounted to another one of the outer side surfaces 111 of the main frame 11). The function mating connector 32 is configured to be another pogo pin that mates with the at least one of the pogo pins 123b on the one of the outer side surfaces 111 which the function case frame 31 is mounted to so that the electric power provided by power supply unit 42 and control signals provided by the motherboard 41 may be transferred to the at least one functional unit 43 through the adaptor subunit 121. Therefore, even in one embodiment where the computer case assembly includes a plurality of the function case modules 3, the user may still change a relative position among the main case module 1, the power case module 2 and the function case modules 3 according to the actual requirements, and may still assemble the main case module 1, the power case module 2, and the function case modules 3 in a relatively short period. Furthermore, referring to FIGS. 1 and 2 again, in the first embodiment, the function case module 3 and the heat-dissipating unit 431 are located under the main case module 1 and the power case module 2 and the function case frame 31 is also mounted to the power case frame 21. The computer component units further include an auxiliary fan 411 that is disposed on the main case module 1 and that is located on the fans of the heat-dissipating unit 431 so that air may enter a bottom side of the computer system and then leave from a top side of the computer system, thereby forming a vertical air flow. It is noted that, in one embodiment, the power case module 2 may be mounted to a front side of the main case module 1.

Figure 4:
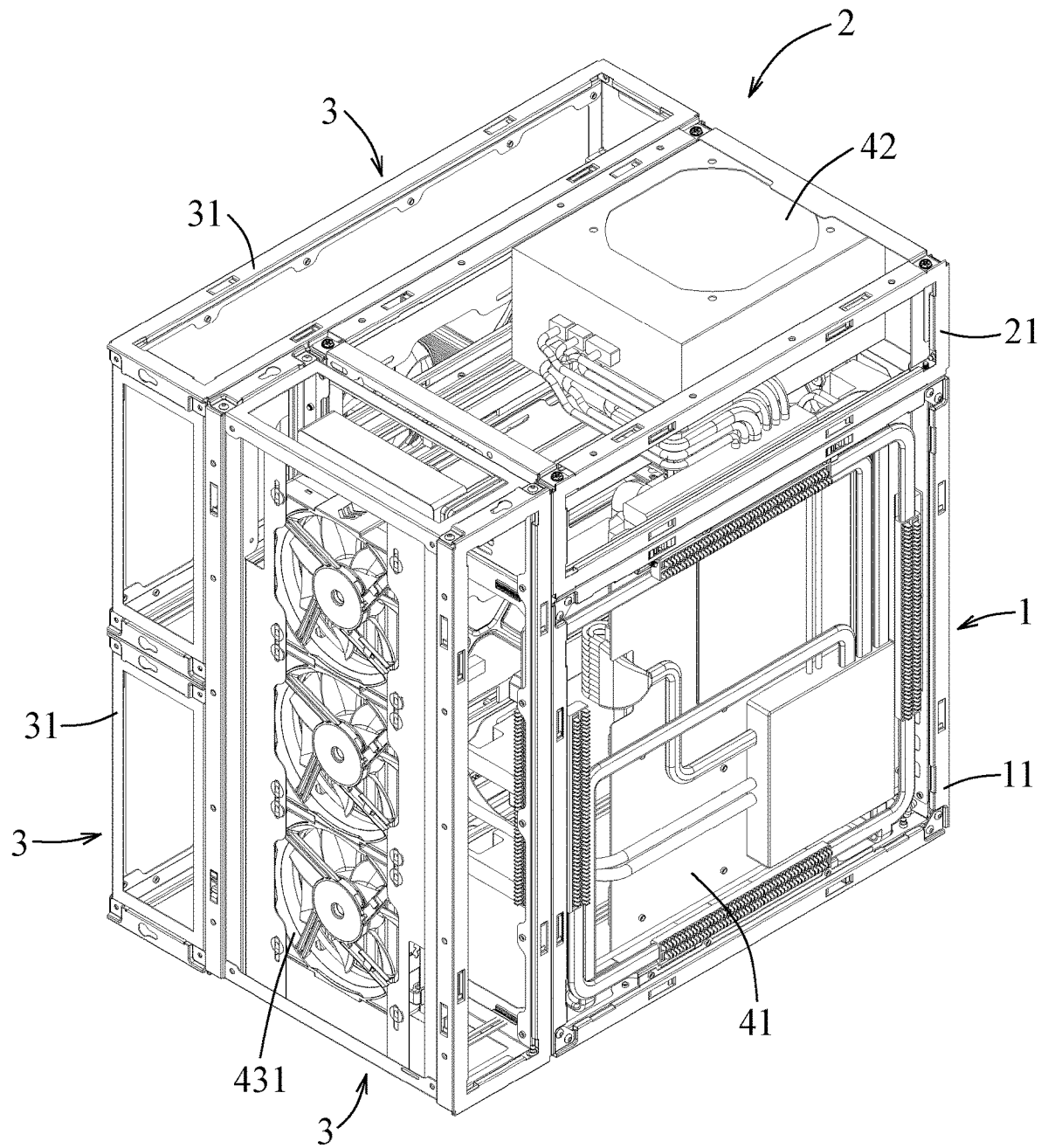
FIG. 4 is a perspective view of a second embodiment of the computer case assembly according to the disclosure.
Figure 5:
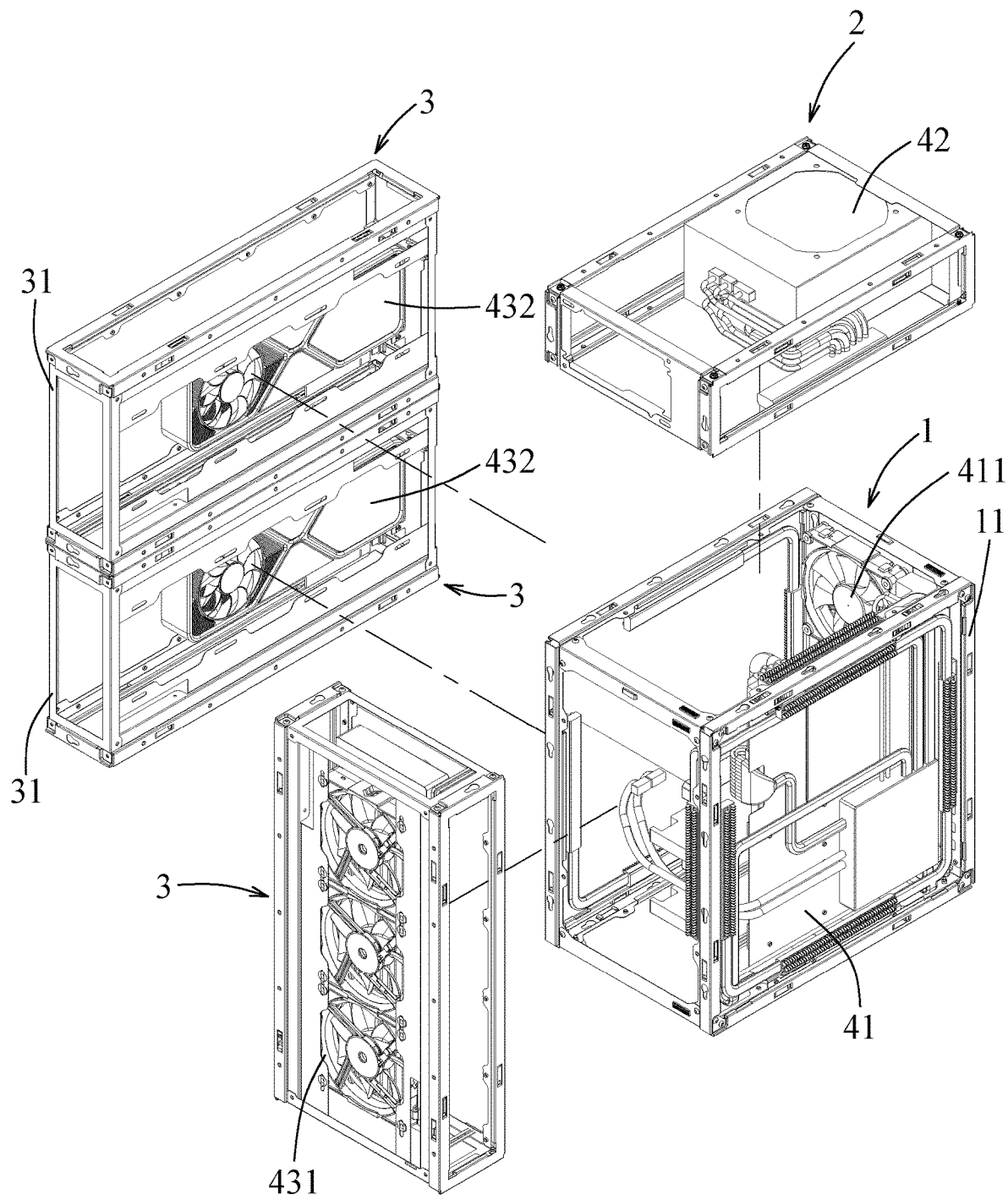
FIG. 5 is a partly exploded perspective view of the second embodiment.
Figure 6:
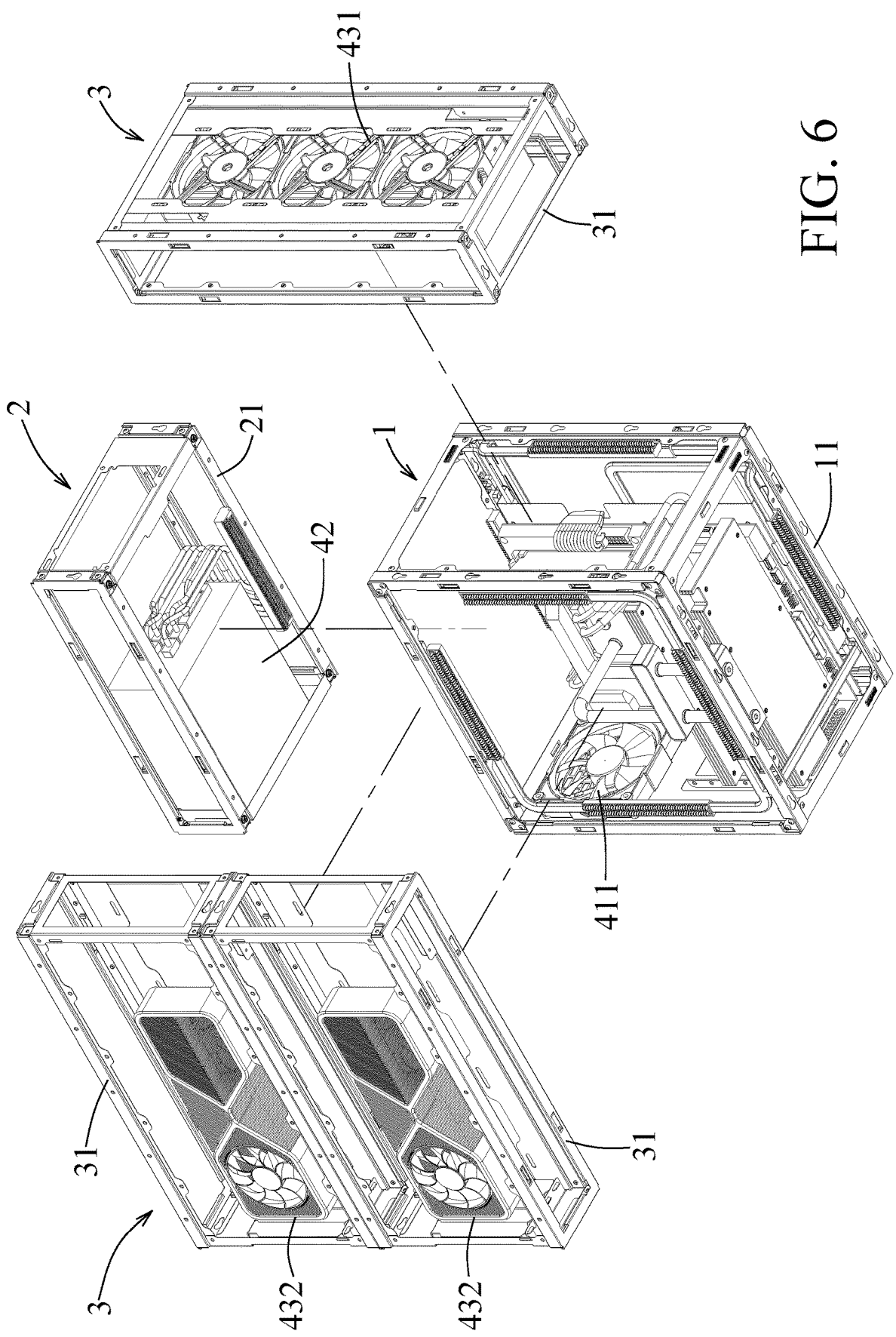
FIG. 6 is a partly exploded perspective view of the second embodiment taken from another angle.

Referring to FIGS. 4 to 6, a second embodiment of the computer case assembly according to the disclosure includes the main case module 1, the power case module 2, and three function case modules 3. The at least one functional unit 43 includes the heat-dissipating unit 431 that is mounted to one of the function case modules 3, and two GPUs 432 that are respectively mounted to the other two of the function case modules 3. In the second embodiment, as shown in FIGS. 4 and 5, the auxiliary fan 411 is mounted to a rear side of the main case module 1, which is where the auxiliary fan 411 is conventionally located. The power case module 2 is located above the main case module 1. The function case module 3 that is provided with the heat-dissipating unit 431 is located in front of the main case module 1. The function case modules 3 that are respectively provided with the GPUs 432 are arranged in an up-down direction, and are mounted to a left side of the main case module 1. The power case frame 21 is mounted to the main frame 11, the function case frame 31 of the function case module 3 provided with the heat-dissipating unit 431, and the function case frame 31 of at least one of the function case modules 3 provided with the GPUs 432. The function case frames 31 of the function case modules 3 are mounted to each other. The power case module 2, the function case modules 3, and the main case module 1 in the second embodiment are connected to each other in a same way (e.g., via connectors thereof and screws) as disclosed in the first embodiment.

Figure 7:
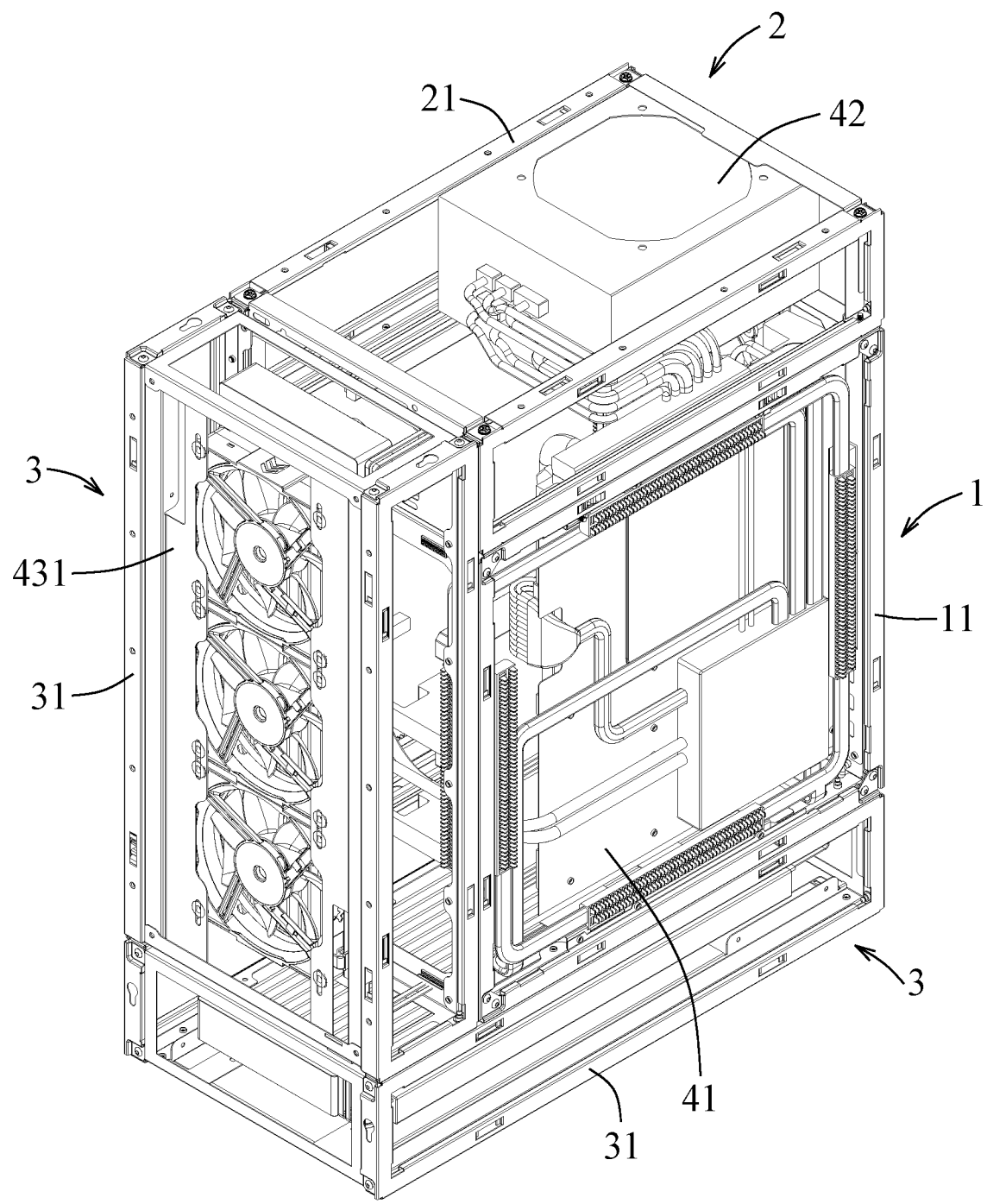
FIG. 7 is a perspective view of a third embodiment of the computer case assembly according to the disclosure.
Figure 8:
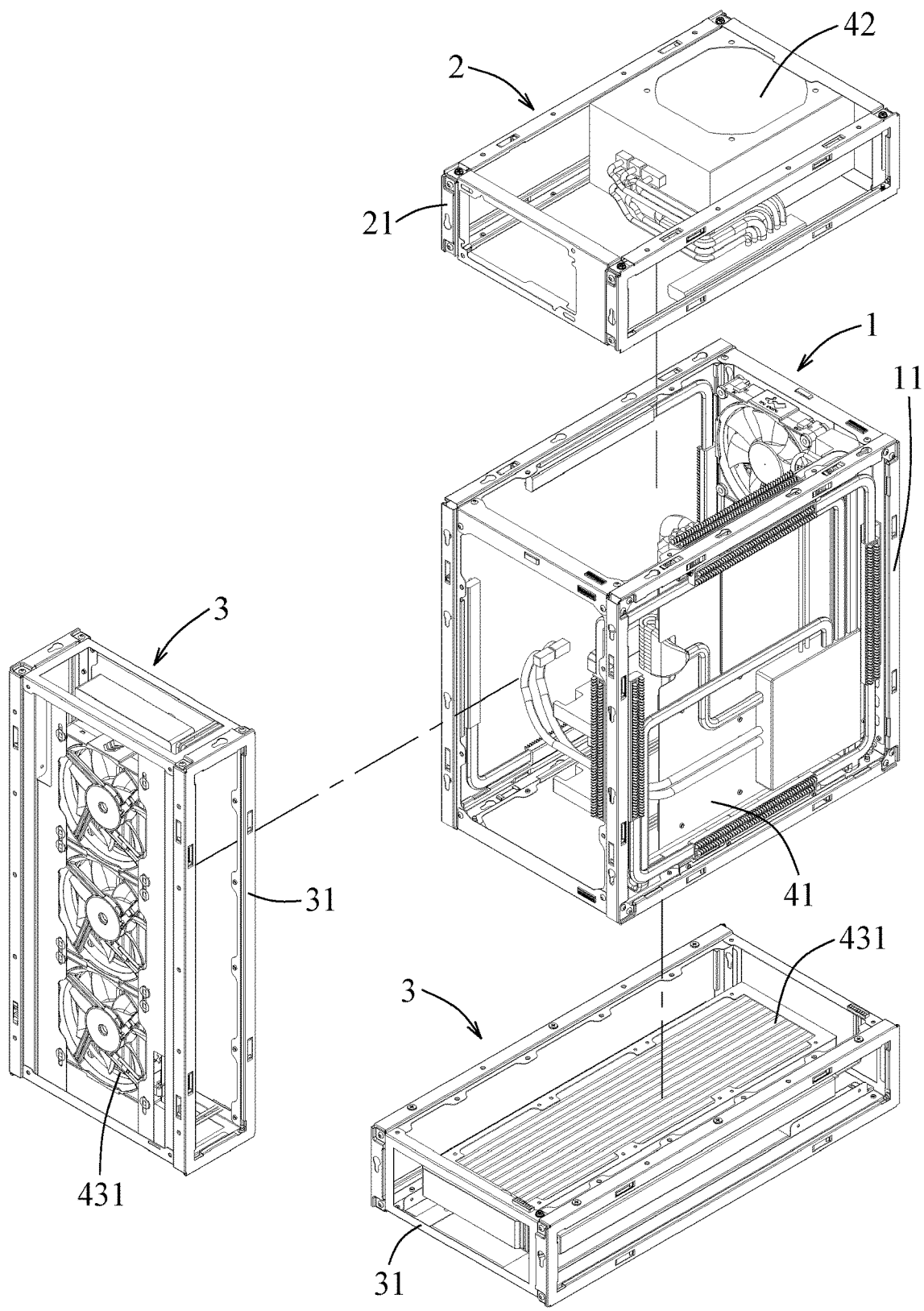
FIG. 8 is a partly exploded perspective view of the third embodiment.
Figure 9:
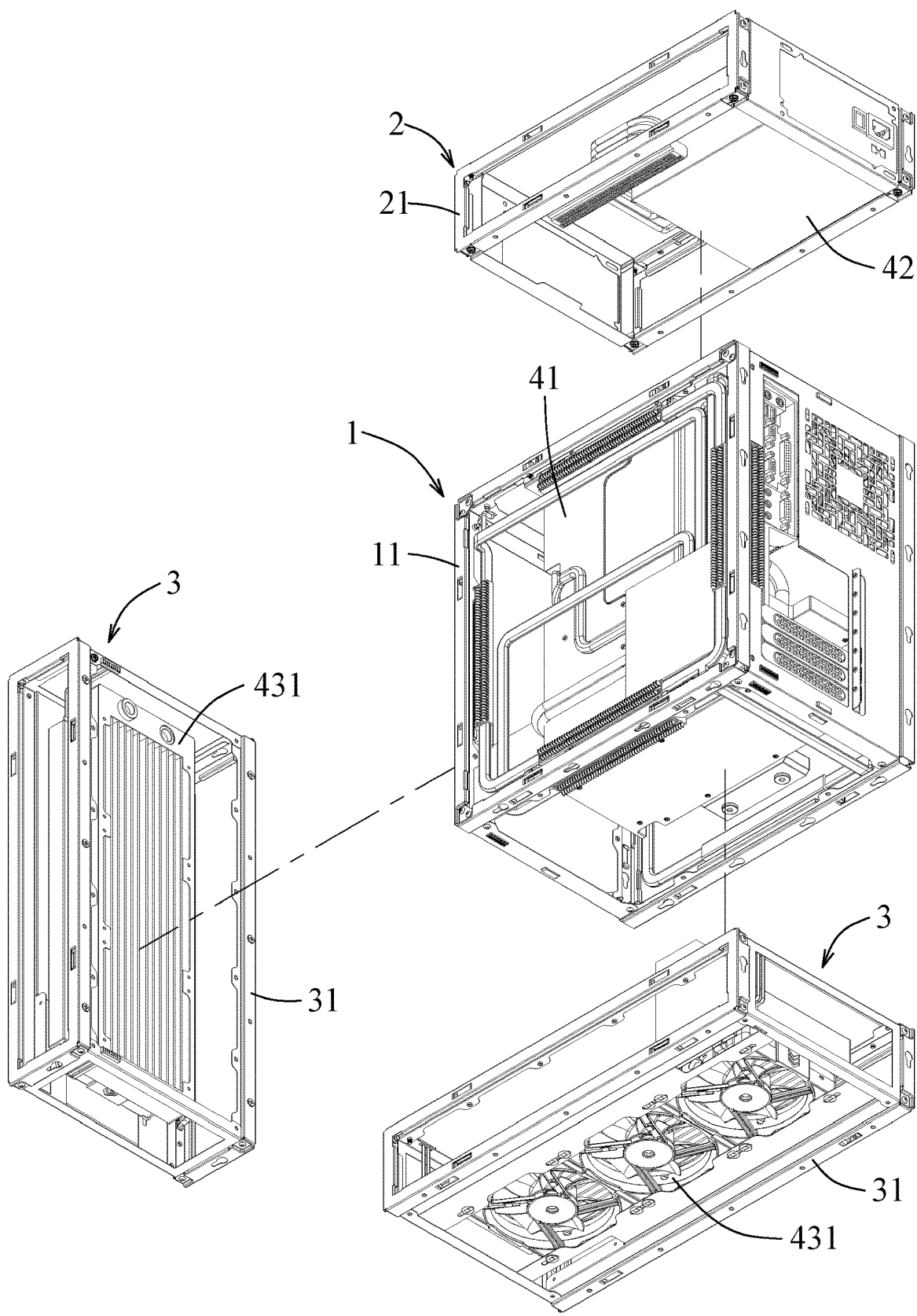
FIG. 9 is a partly exploded perspective view of the third embodiment taken from another angle.

Referring to FIGS. 7 to 9, a third embodiment of the computer case assembly according to the disclosure includes the main case module 1, the power case module 2, and two function case modules 3. Each of the function case module 3 is provided with the heat-dissipating unit 431. In the third embodiment, as shown in FIGS. 7 and 8, the power case module 2 is located above the main case module 1. One of the function case modules 3 is located in front of the main case module 1, and the other one of the function case modules 3 is located under the main case module 1. The power case module 2, the function case modules 3, and the main case module 1 in the third embodiment are connected to each other in the same way as disclosed in the first embodiment.

Figure 10:
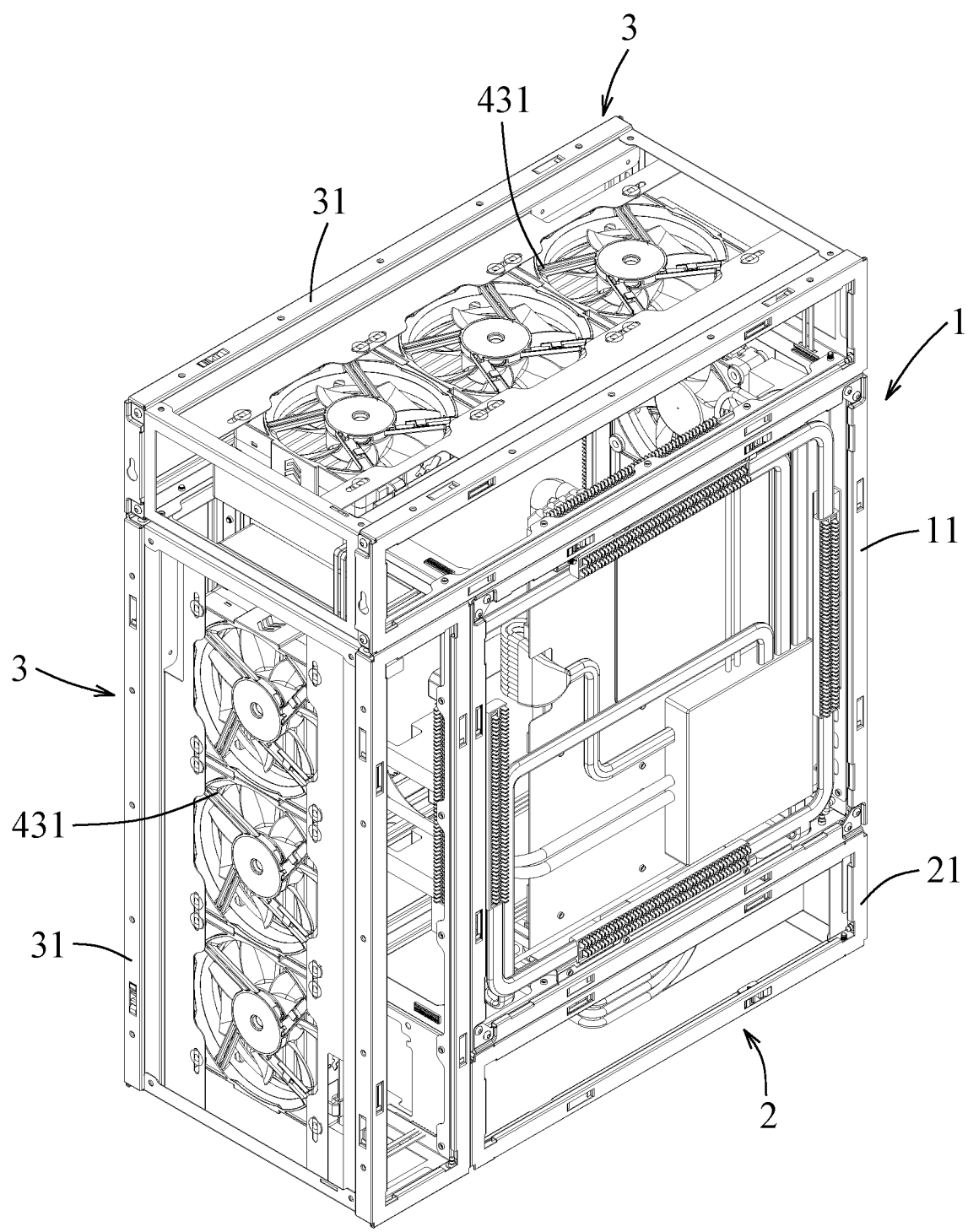
FIG. 10 is a perspective view of a fourth embodiment of the computer case assembly according to the disclosure.
Figure 11:
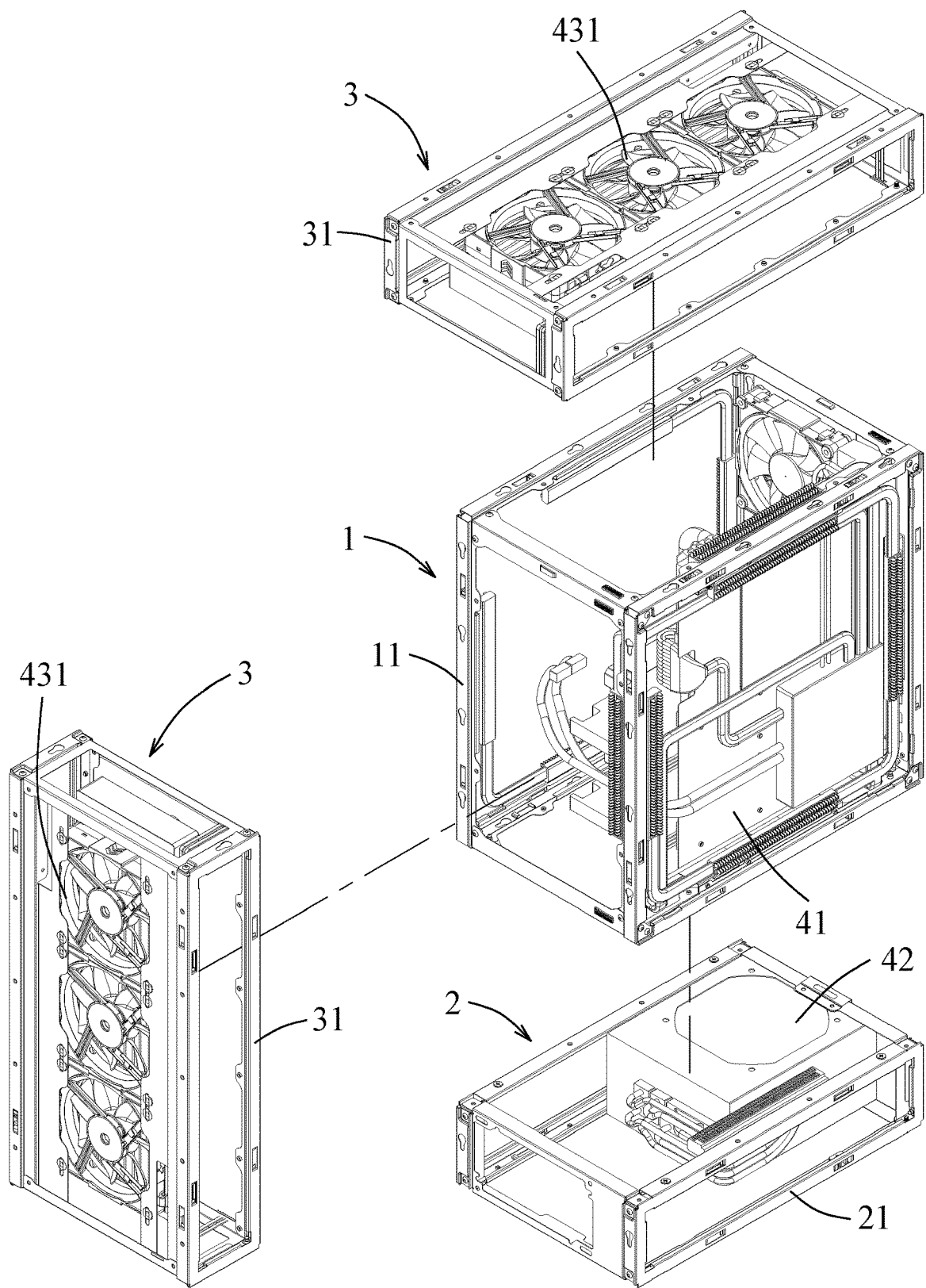
FIG. 11 is a partly exploded perspective view of the fourth embodiment.
Figure 12:
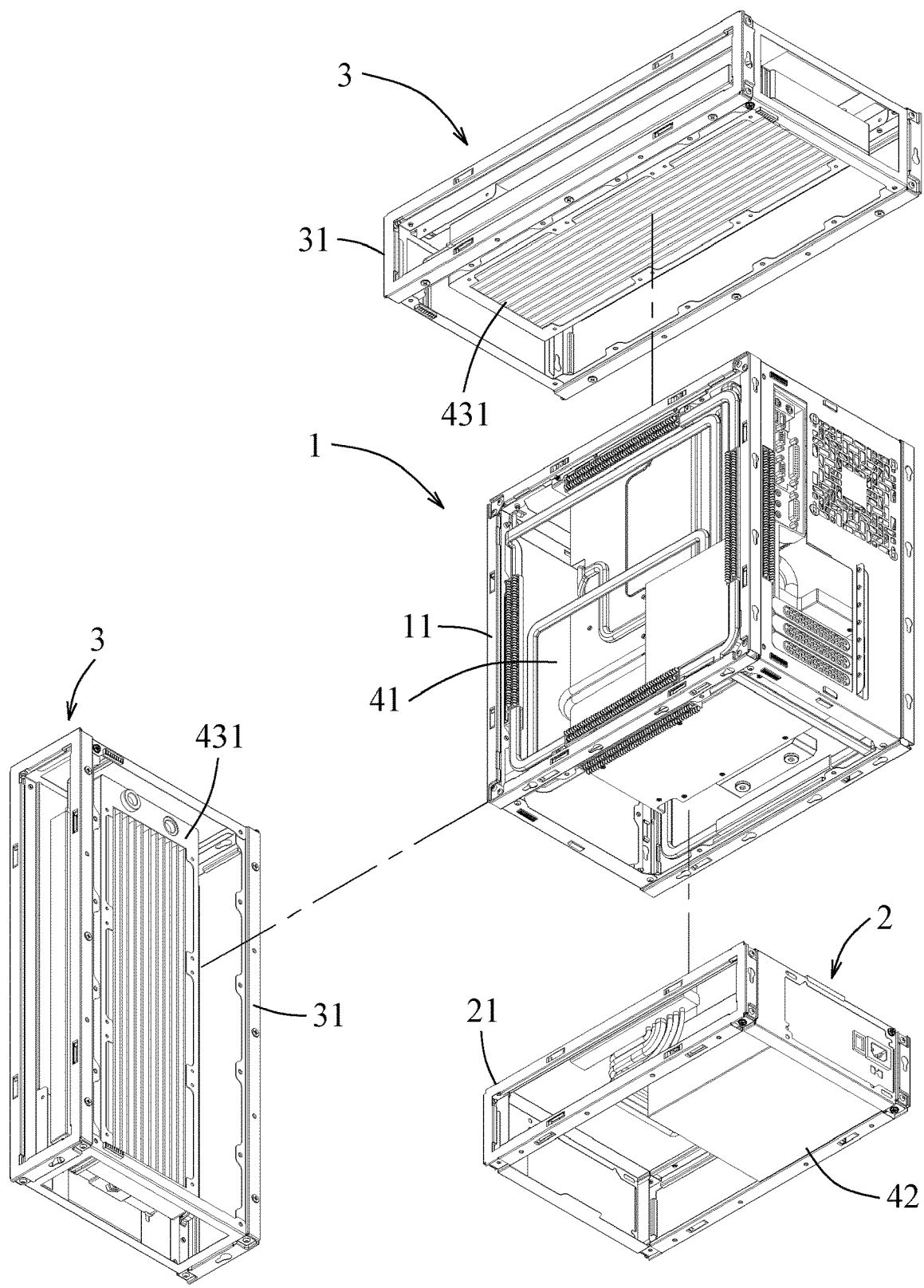
FIG. 12 is a partly exploded perspective view of the fourth embodiment taken from another angle.

Referring to FIGS. 10 to 12, a fourth embodiment of the computer case assembly according to the disclosure is similar to the third embodiment, but differs in relative positions of the power case module 2, the function case modules 3, and the main case module 1. In the fourth embodiment, the power case module 2 is located under the main case module 1, and the functional modules 3 are respectively located in front of and above the main case module 1.

Figure 13:
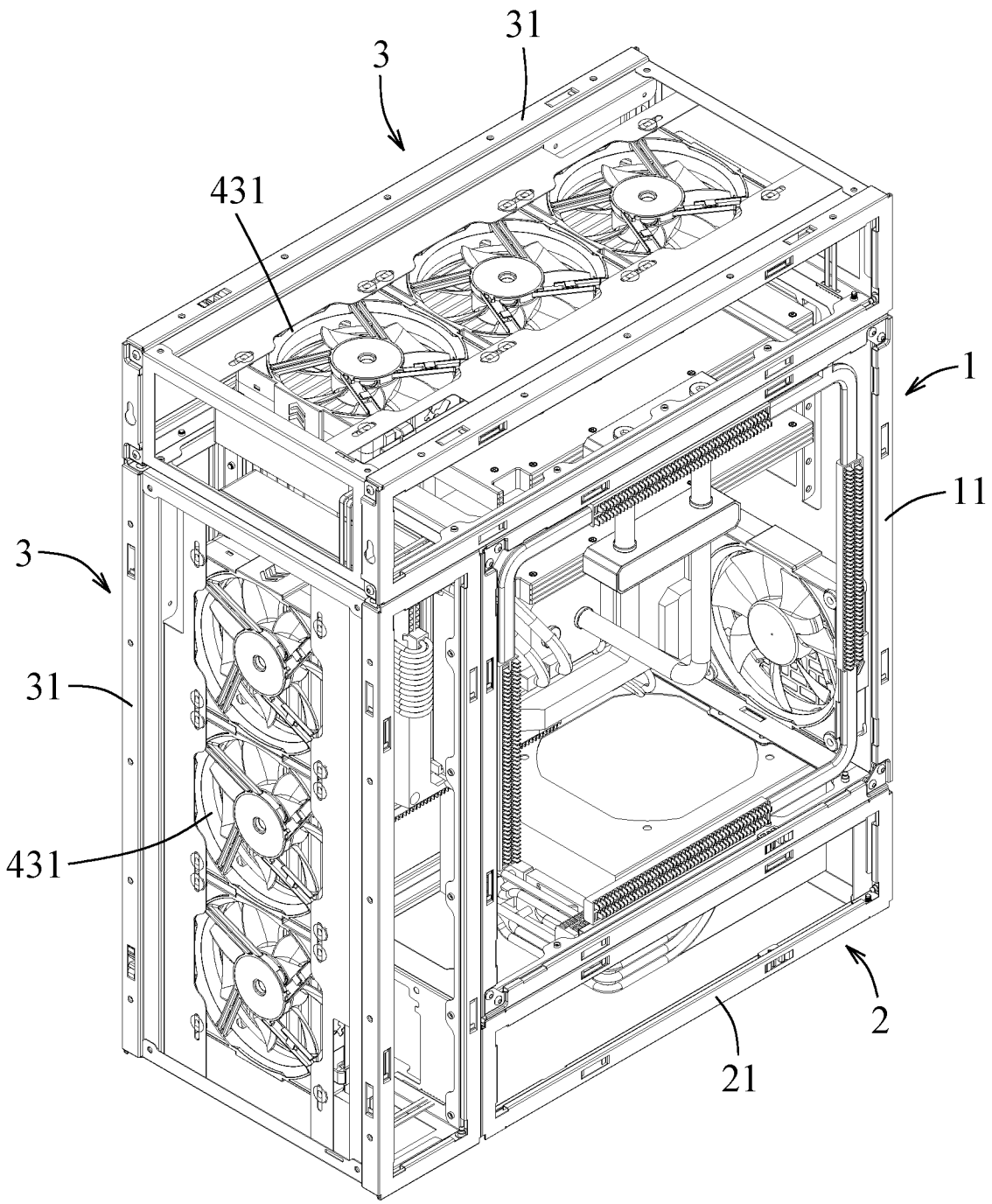
FIG. 13 is a perspective view of a fifth embodiment of the computer case assembly according to the disclosure.
Figure 14:
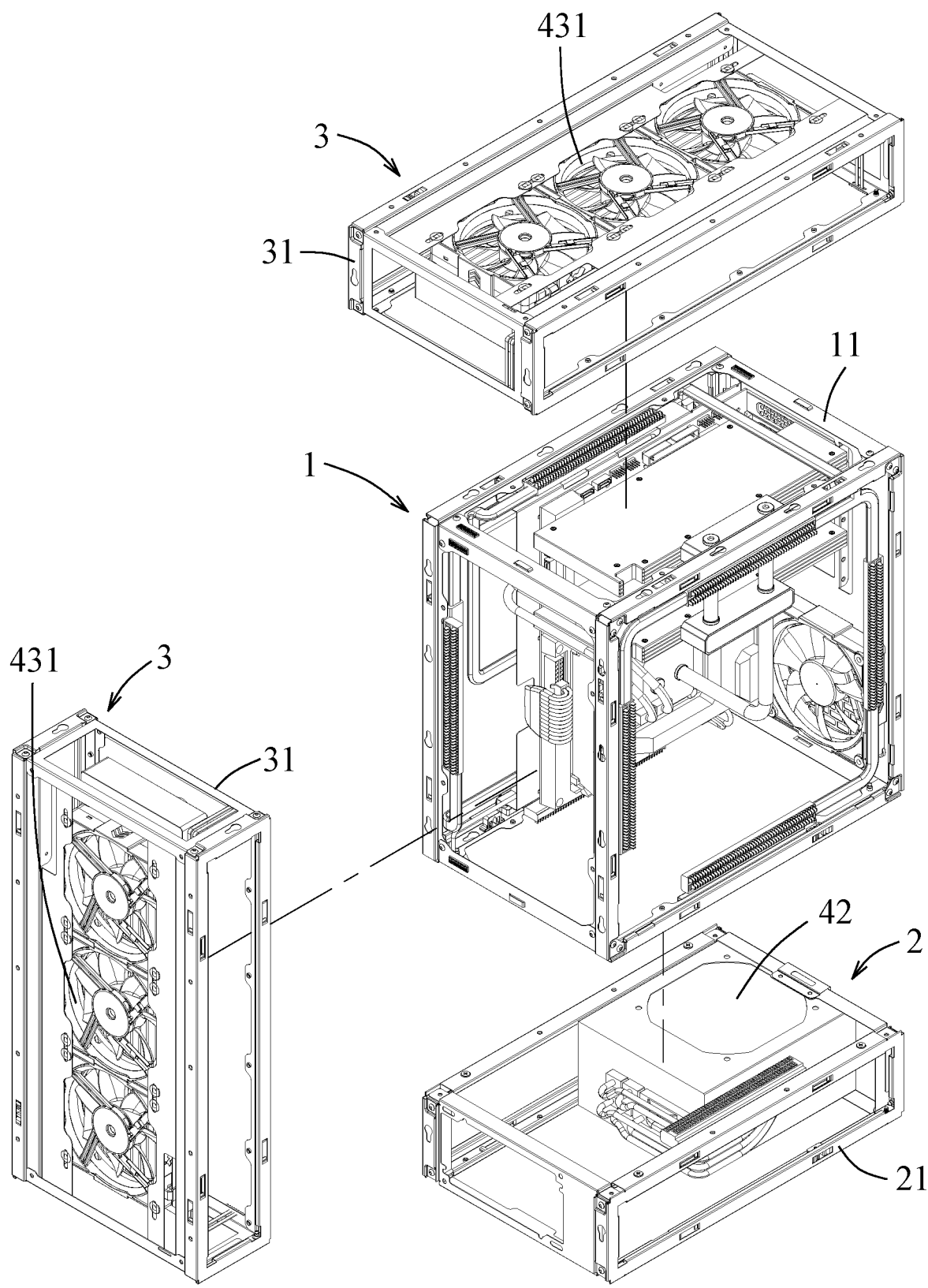
FIG. 14 is a partly exploded perspective view of the fifth embodiment.
Figure 15:
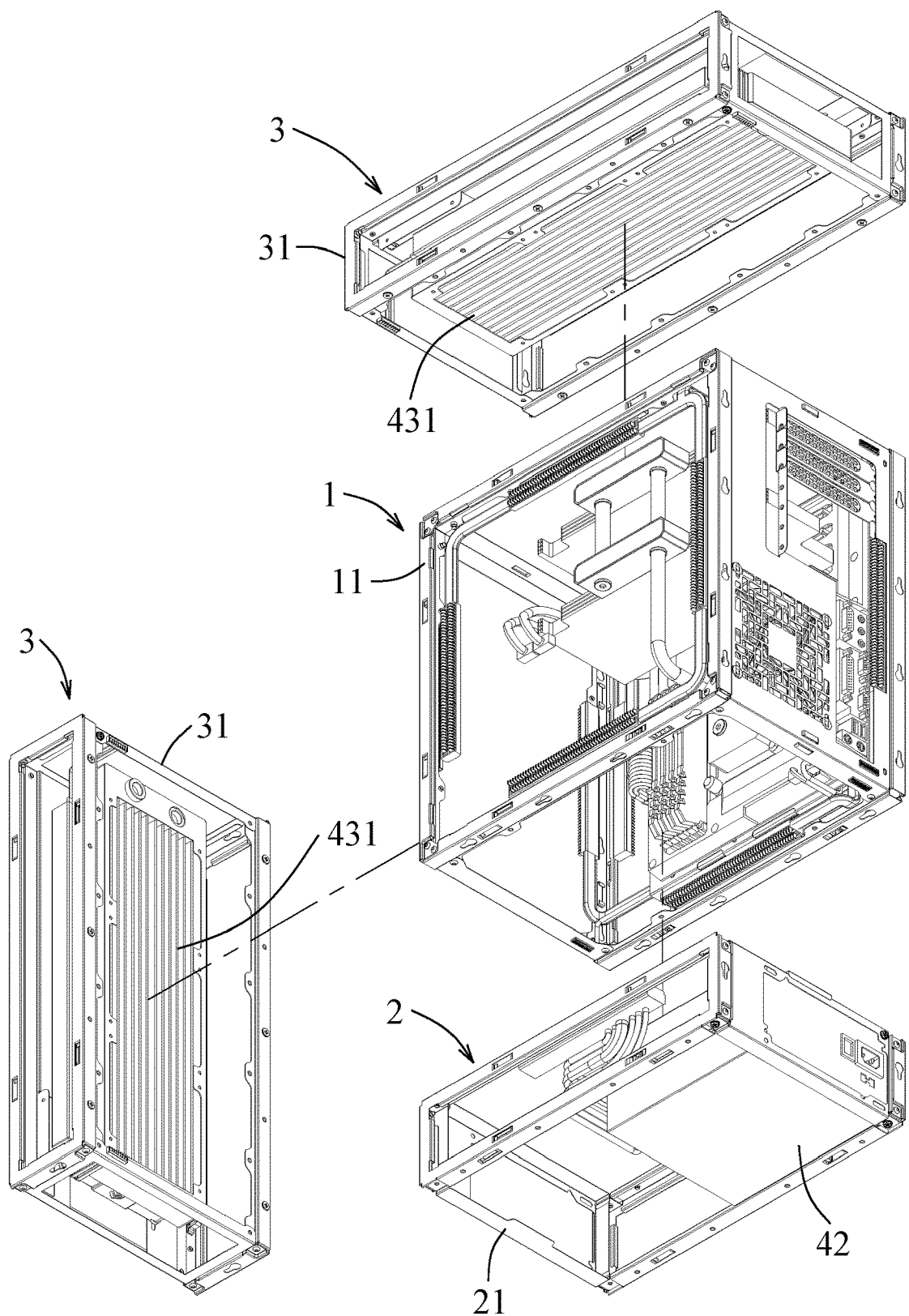
FIG. 15 is a partly exploded perspective view of the fifth embodiment taken from another angle.

Referring to FIG. 13 to FIG. 15, a fifth embodiment of the computer case assembly according to the disclosure is similar to the fourth embodiment, but differs in that the main case module 1 is turned upside down.

Figure 16:
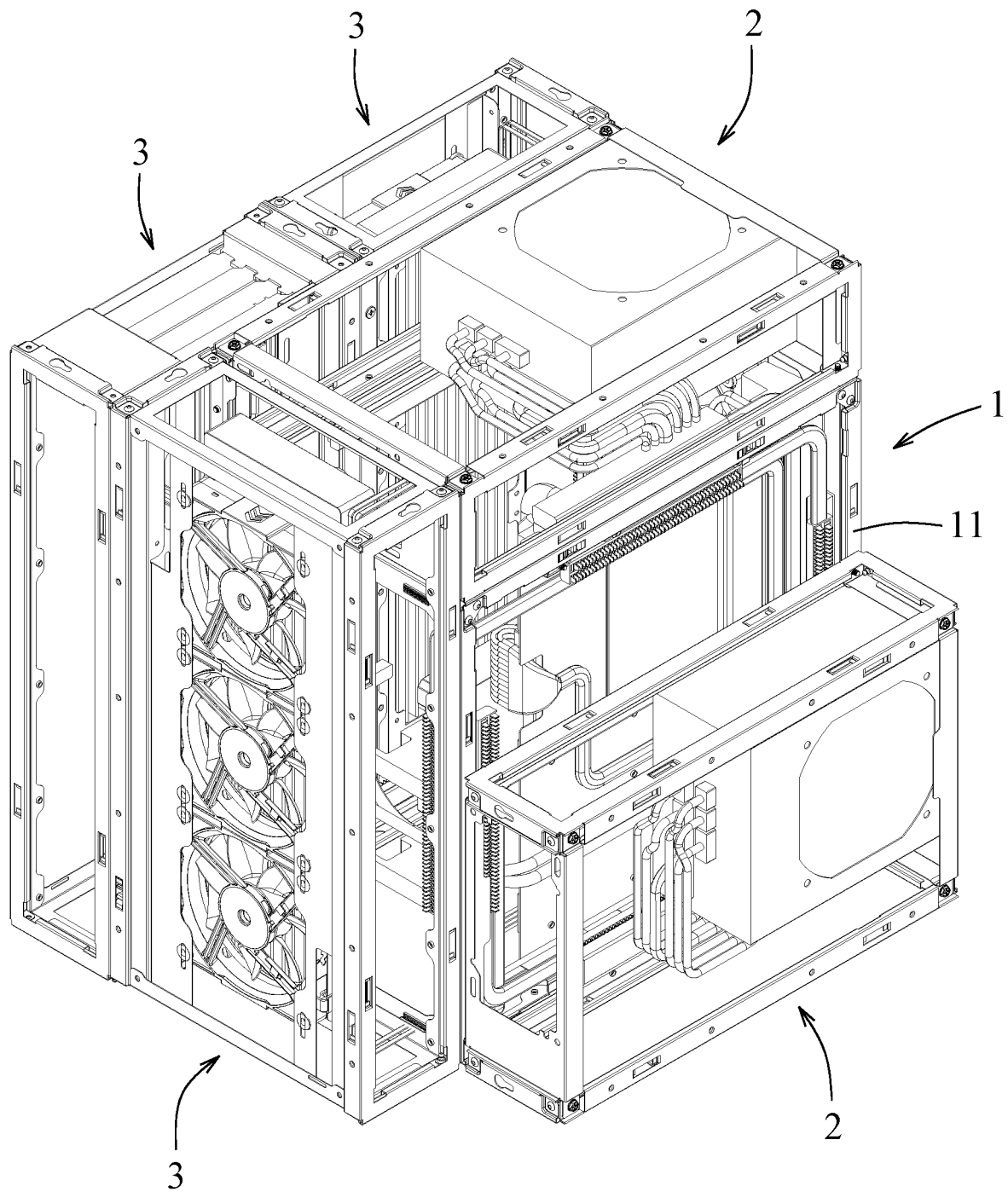
FIG. 16 is a perspective view of a sixth embodiment of the computer case assembly according to the disclosure.
Figure 17:
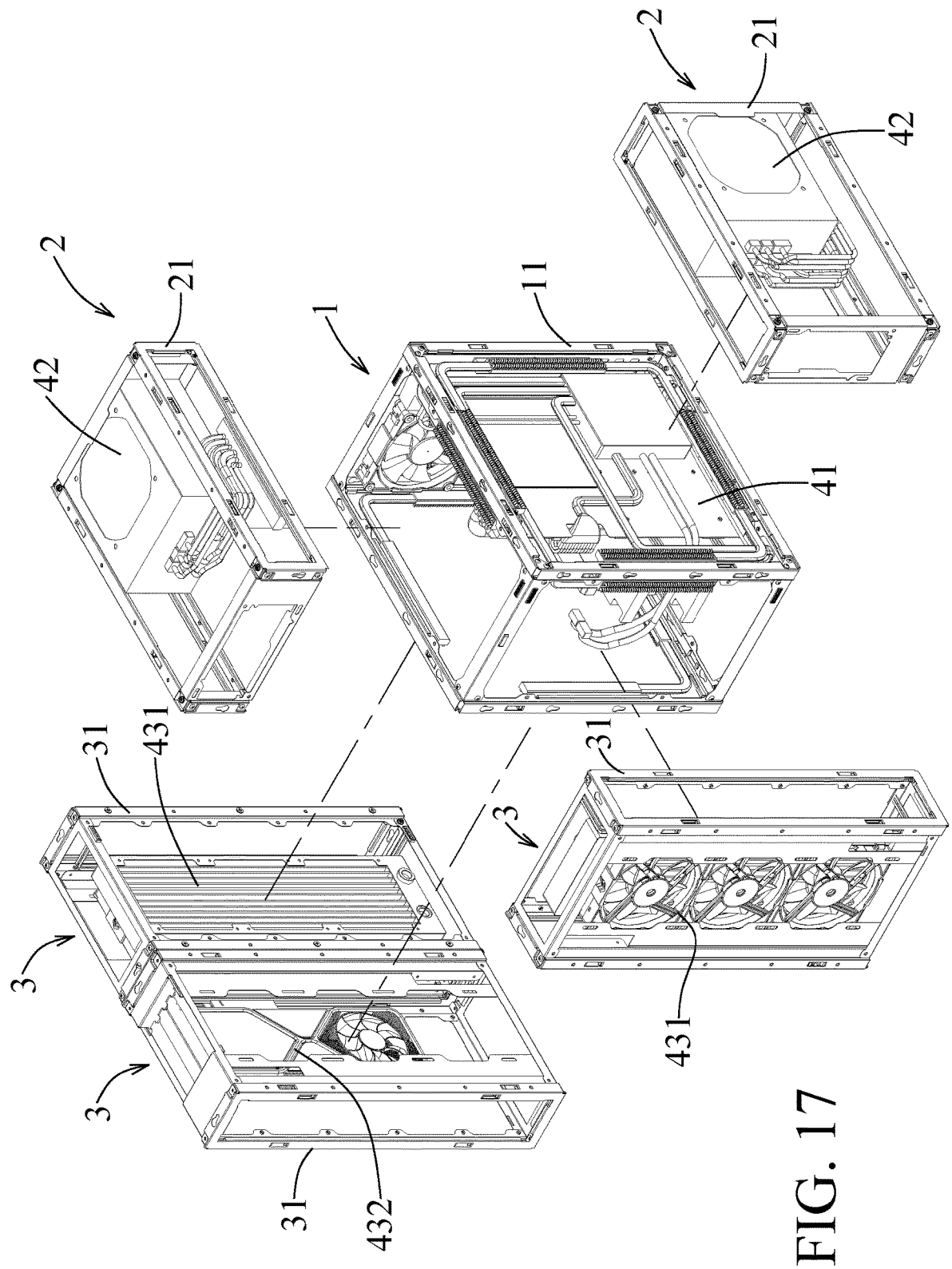
FIG. 17 is a partly exploded perspective view of the sixth embodiment.
Figure 18:
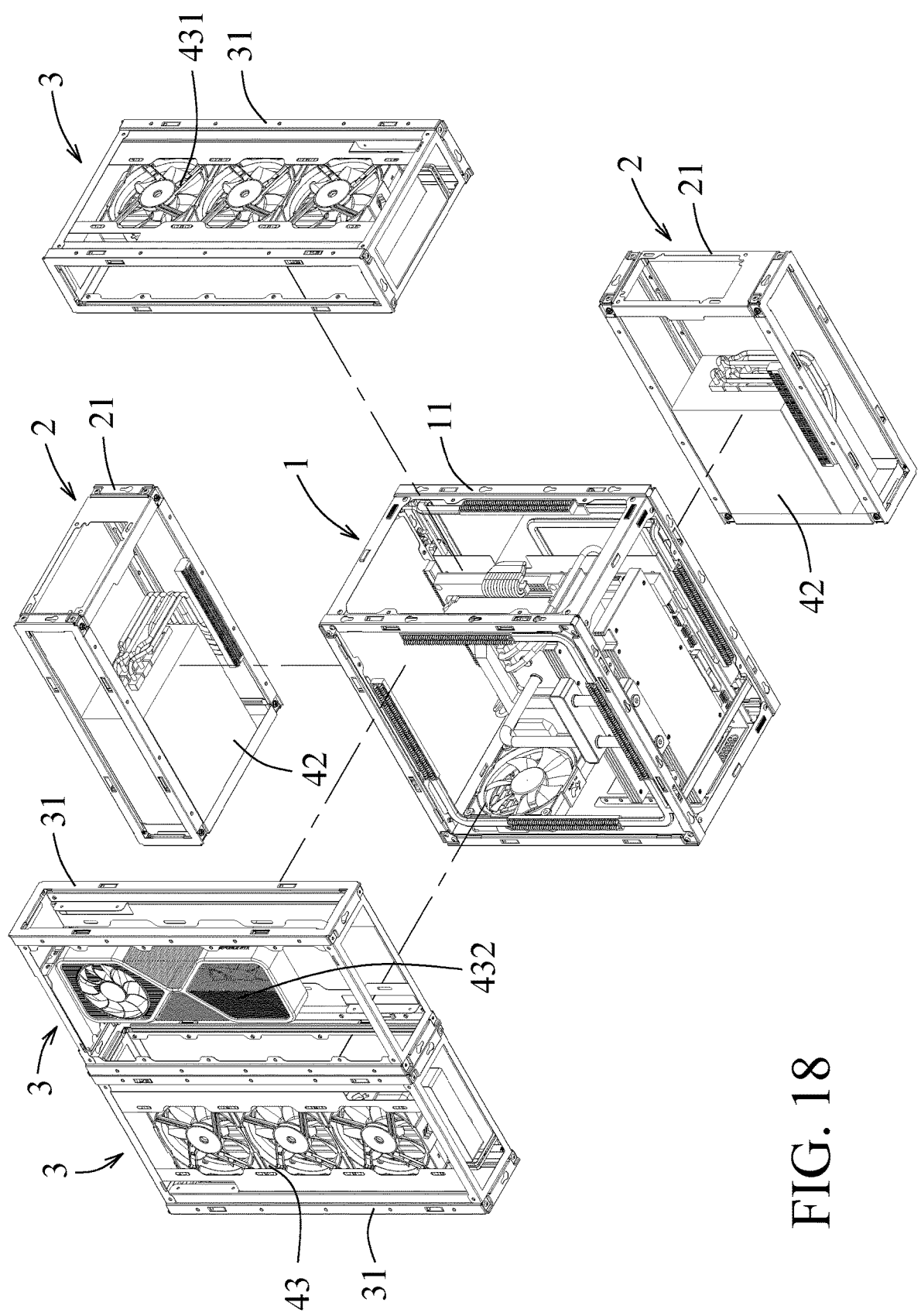
FIG. 18 is a partly exploded perspective view of the sixth embodiment taken from another angle.

Referring to FIGS. 16 to 18, a sixth embodiment of the computer case assembly according to the disclosure includes the main case module 1, two power modules 2, and three function modules 3. Each of the power modules 2 is provided with the power supply unit 42. One of the function case modules 3 is provided with the GPU 432, and the other two of the function case modules 3 are respectively provided with two heat-dissipating units 431. In the sixth embodiment, as shown in FIGS. 16 and 17, one of the power case modules 2 is located above the main case module 1, and the other one of the power case modules 2 is located at a right side of the main case module 1. One of the function case modules 3 that are respectively provided with the heat-dissipating units 431 is located in front of the main case module 1. The function case module 3 that is provided with the GPU 432 and the other one of the function case modules 3 that are respectively provided with the heat-dissipating units 431 are arranged in a front-rear direction, and are located at the left side of the main case module 1. The power case modules 2, the function case modules 3, and the main case module 1 are connected to each other in the same way as disclosed in the first embodiment.

It is noted that, in certain embodiments, the computer component units may further include add-on units, such as a cooling unit (not shown) and a storage unit (not shown). The add-on units may be mounted to at least one of the main frame 11 and the power case frame 21.

In the abovementioned embodiments, by virtue of one of the electrical connectors 123 mating with the power mating connector 22, and by virtue of another one of the electrical connectors 123 mating with the function mating connector 32, the main case module 1, the power case module 2, and the function case module 3 may be assembled within a relatively short period. However, in certain embodiments, the main case module 1 may only include the main frame 11 for the motherboard 41 to be mounted to, the power case module 2 may only include the power case frame 21 for the power supply unit 42 to be mounted to, the at least one function case module 3 may only include the function case frame 31 for the at least one functional unit 43 to be mounted to, and the motherboard 41 may be electrically coupled to the power supply unit 42 and the at least one functional unit 43 via additional wires.

In summary, the main frame 11 may be detachably mounted to one or more power case frames 21, and may be detachably mounted to one or more function case frames 31. Therefore, the relative positions among the main case module 1, the power case module(s) 2, and the function case module(s) 3 may be easily changed, and the user may arrange positions of these computer component units as desired. In addition, diverse combinations of computer component units can be assembled in different instances and flexibility of scaling up the functional units 43 in number may also be achieved.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A computer case assembly adapted for computer component units of a computer system to be mounted to, the computer component units including a motherboard and a power supply unit, the computer case assembly comprising: a main case module including a main frame that is cuboid-shaped and that is adapted for the motherboard to be mounted to; and a power case module including a power case frame that is cuboid-shaped, that is adapted for the power supply unit to be mounted to, and that is detachably mounted to the main frame; and the main case module further includes an electrical connection unit that is mounted to the main frame, the electrical connection unit including an adaptor subunit, a wire subunit and a plurality of electrical connectors, the adaptor subunit being electrically coupled to the motherboard and the electrical connectors via the wire subunit, the main frame having a plurality of outer side surfaces cooperatively define a cuboid-shaped accommodating space, the electrical connectors being mounted to the outer side surfaces of the main frame, the power case module further including a power mating connector that is mounted to the power case frame thereof, the power mating connector being adapted to be electrically coupled to the power supply unit, and mating with one of the electrical connectors when the power case frame is mounted to a side of the main frame; and the computer component units further including at least one functional unit, the computer case assembly further comprising at least one function case module, the at least one function case module including a function case frame that is cuboid-shaped and that is for the at least one functional unit to be mounted to, and a function mating connector that is mounted to the function case frame, the function case frame being detachably mounted to the main frame, the function mating connector being adapted to be electrically coupled to the at least one functional unit, and mating with another one of the electrical connectors when the function case frame is mounted to another side of the main frame.

\* \* \* \* \*